US006815605B1

United States Patent
Abe et al.

(10) Patent No.: US 6,815,605 B1
(45) Date of Patent: Nov. 9, 2004

(54) SILICON SINGLE CRYSTAL AND WAFER DOPED WITH GALLIUM AND METHOD FOR PRODUCING THEM

(75) Inventors: Takao Abe, Annaka (JP); Teruhiko Hirasawa, Annaka (JP); Katsushi Tokunaga, Annaka (JP); Tetsuya Igarashi, Takefu (JP); Masafumi Yamaguchi, Nagoya (JP)

(73) Assignees: Shin-Etsu Handotai Co., Ltd., Tokyo (JP); Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/743,982

(22) PCT Filed: Apr. 28, 2000

(86) PCT No.: PCT/JP00/02850

§ 371 (c)(1),
(2), (4) Date: Jan. 18, 2001

(87) PCT Pub. No.: WO00/73542

PCT Pub. Date: Dec. 7, 2000

(30) Foreign Application Priority Data

May 28, 1999 (JP) ............................................ 11-150697
Sep. 17, 1999 (JP) ............................................ 11-264549

(51) Int. Cl.$^7$ ...................... C03B 15/04; H01L 31/028; C01B 33/02
(52) U.S. Cl. .......................... 136/261; 423/348; 117/19; 117/15; 117/41
(58) Field of Search .............................. 117/13, 15, 19, 117/41, 928; 136/261, 292; 423/324, 325, 348

(56) References Cited

U.S. PATENT DOCUMENTS 4,134,785 A * 1/1979 Lavigna et al. ............. 156/601
4,152,536 A * 5/1979 Ravi ......................... 139/89 SJ
5,700,320 A * 12/1997 Izunome et al. ............... 117/19
5,704,974 A * 1/1998 Izunome et al. ............... 117/28
6,147,297 A * 11/2000 Wettling et al. ............ 136/256

FOREIGN PATENT DOCUMENTS

| JP | 64-27278 | | 1/1989 | |
|----|----------|----|--------|----|
| JP | 5-208892 | | 8/1993 | |
| JP | 6-169096 | | 6/1994 | |
| JP | 7-206583 | | 8/1995 | |
| JP | 8-259382 | | 10/1996 | |
| JP | 8-330611 | | 12/1996 | |
| JP | 08-330611 | * | 12/1996 | ........... H01L/31/04 |
| JP | 10-324592 | | 12/1998 | |

OTHER PUBLICATIONS

Minahan et al., Conf. Rec. IEEE Photovoltaic Spec. Conf. (1982), 16$^{th}$, 310–15.*

(List continued on next page.)

Primary Examiner—Nadine G. Norton
Assistant Examiner—Matthew Anderson
(74) Attorney, Agent, or Firm—Oliff & Berridge, PLC (57) ABSTRACT

There can be provided according to the present invention a silicon single crystal produced according to Czochralski method to which Ga (gallium) is added as a dopant characterized in that a resistivity is 5Ω.cm to 0.1Ω.cm and a method for producing a silicon single crystal to which Ga (gallium) is added as a dopant according to Czochralski method characterized in that Ga is added in a silicon melt in a crucible, a seed crystal is brought into contact with the silicon melt and is pulled with rotating to grow a silicon single crystal ingot. Thereby, a silicon single crystal and silicon single crystal wafer and a method for producing them that can produce a solar cell characterized in that photodegradation is not caused even in the single crystal having high oxygen concentration and a conversion efficiency of optical energy is very high.

38 Claims, 6 Drawing Sheets

OTHER PUBLICATIONS

Wolf et al., Silicon Processing for the VLSI Era, vol. 1: Process Technology, Lattice Press, Sunset Beach, CA, USA, pp. 1–35, 1986.*

Commonwealth of Australia, *Solar Energy Patents*, 102 (1983).

J.A. Minahan et al., "Irradiated Solar Cells Fabricated From Gallium–Doped/Boron–Doped FZ and CZ Silicon", *IEEE*, pp. 310–315, 1982.

J. Schmidt et al., "Investigation of Carrier Lifetime Instabilities in CZ–Grown Silicon," $26^{th}$ *Annual Photovoltaic Specialists Conference*, pp. 1–6, 1997.

T. Saitoh et al., *Light Degradation and Control of Low–Resistivity CZ–Si Solar Cells, Technical Digest of the International PVSEC–11*, 1999, pp. 553–556.

Special Paper Award, $11^{th}$ International Photovoltic Science and Engineering Conference.

S.W. Glunz et al., *Comparison of Boron– and Gallium–doped p–Type Czochralski Silicon for Photovoltic Application, Prog. Photovolt. Res. Appl.* 1999; vol. 7; pp. 463–469.

S. W. Glunz et al., *100 cm2 Solar Cells on Czochralski Silicon with an Efficiency of 20•2%, Prog. Photovolt. Res. Appl.* 2000, vol. 8; pp. 237–240.

Ehrstein, J. R. Spreading Resistance Calibration for Gallium– or Aluminum Doped Silicon, 1980, J. Electrochem. Soc., vol. 127, No. 6, pp. 1403–1404.

Denki, Kagaku, Kyoukai, Denshi, Zairyou, Inkai Ed., "Handoutai Zairyou" Jul. 30, 1970, p. 87 lines 6–7; p. 97, in Japanese.

Yamamoto, Mikio ed., "Kesshou Kougaku Handbook", Sep. 10, 1975, Kyouritsu Shuppan K. K., p. 643, left colum, line 28 to right column, line 22; Table VII 3 8.

* cited by examiner

SILICON SINGLE CRYSTAL AND WAFER DOPED WITH GALLIUM AND METHOD FOR PRODUCING THEM

BACKGROUND OF THE INVENTION

1. Technical Field

The present invention relates to a silicon single crystal produced by Czochralski method (hereinafter occasionally referred to as "Czochralski method", "CZ method", or a pulling method), which is especially useful for material of solar cell, a method for producing it and a silicon single crystal solar cell produced using it.

2. Background Art

First, characteristics of a solar cell will be explained, in relation to a substrate material constituting the solar cell. The solar cell can be roughly classified on the basis of material of the substrate, into three types of silicon crystal solar cell, amorphous silicon solar cell, and compound semiconductor solar cell. The silicon crystal solar cell can be further classified into single crystal solar cell and polycrystal solar cell. The solar cell having the highest conversion efficiency that is the most important characteristics as a solar cell is the compound semiconductor solar cell among them, of which conversion efficiency is almost 25%. However, it is difficult to produce a compound semiconductor that is material of the compound semiconductor solar cell, and the compound semiconductor solar cell has a problem of cost for production, so that it cannot be generally and widely used. Accordingly, it can be used only for a limited purpose.

In the following description, the word "Conversion efficiency" means "the rate of energy that can be taken out by being converted to electric energy with a solar cell", that is represented as a percentage (%).

The solar cell having the highest conversion efficiency except the compound semiconductor solar cell is silicon single crystal solar cell, of which power generation efficiency is about 20% that is close to conversion efficiency of the compound semiconductor solar cell. The substrate for the silicon crystal solar cell can be prepared relatively easily. Accordingly, it is a major type of solar cell used generally. Furthermore, silicon polycrystal solar cell and amorphous silicon solar cell or the like have also been used practically, since the material of the substrate for them can be produced at low cost, although conversion efficiency of them is about 5 to 15%, which is lower than that of the above-mentioned two types of solar cell.

Secondly, a general method for producing a silicon single crystal solar cell will be explained below. First, in order to make silicon wafer to be a substrate of a solar cell, a columnar silicon single crystal ingot is produced according to Czochralski method or a floating zone melting method (hereinafter occasionally referred to as FZ method, Floating zone method). Then the ingot is sliced to give a thin wafer having a thickness of, for example about 300 $\mu$m, and a mechanical damage on the surface of the wafer is removed by etching with chemical to provide a wafer (substrate) that is to be a solar cell. PN junction is formed on one side of the wafer by a diffusion treatment of impurity (dopant), and thereafter electrode is formed on both surface of the wafer, and finally an antireflection coating film is formed on the surface which gets sunbeam in order to reduce loss of optical energy due to reflection of light, and thereby a solar cell is produced.

Nowadays, a demand for a solar cell as one of clean energy is increased to solve the environmental problems. However, its energy cost is higher than common commercial electric power, which is an obstacle to prevalence thereof. It is necessary for cost reduction of silicon crystal solar cell to decrease production cost of the substrate, and improve conversion efficiency. Accordingly, for reducing the cost of substrate materials, a cone part, a tail part and the like have been used as raw materials, which could not be used for electronic purpose such as production of semiconductor devices or which could not be useful product of single crystal ingot. However, acquisition of such a raw material is unstable, and the amount is limited. Accordingly, in light of increase of a demand on silicon single crystal solar cell, it is difficult to produce a necessary amount of solar cell substrates stably by such a method.

It is also important in the solar cell industry to produce a solar cell having wider area in order to obtain more electric current. CZ method is suitable for producing a silicon wafer with a large diameter which can be substrate materials for production of a solar cell having wider area, since a silicon single crystal having a large diameter can be easily produced according to CZ method, and the produced silicon single crystal is excellent in strength. Accordingly, a silicon single crystal for a solar cell is mainly produced according to CZ method.

A silicon wafer can be used as material for substrate of single crystal solar cell, only where its substrate lifetime (hereinafter occasionally referred to as lifetime, LT), that is one of characteristics thereof, is more than 10 $\mu$s. Furthermore, the lifetime is preferably 200 $\mu$s or more in order to provide a solar cell having a high conversion efficiency.

However, concerning a single crystal produced by CZ method being at present a main method for producing a single crystal ingot, when it is radiated with a strong light after it is processed to be a solar cell, the lifetime of the solar cell substrate is lowered resulting in photo-degradation, so that it is required to be improved also as for performance of the solar cell.

It is known that boron and oxygen existing in the single crystal substrate cause lowering of life time and photo-degradation that is occurred when a solar cell produced using the silicon single crystal produced by CZ method is irradiated with strong light. A conductive type of the wafer that is presently used as a solar cell is mainly P type, and the P type wafer is generally doped with boron as a dopant. Although the single crystal ingot that is material for the wafer can be produced according to CZ method (including MCZ (hereinafter occasionally referred to as Magnetic field applied CZ method) or FZ method, production cost in FZ method is higher than in CZ method, and the silicon single crystal having a large diameter is produced more easily according to CZ method as described above. Accordingly, it is presently produced according to CZ method wherein a single crystal having a large diameter can be produced at relatively low cost.

However, oxygen exists at high concentration in the crystal produced according to a CZ method, and thus there is a problem that boron and oxygen in P type silicon single crystal produced according to CZ method may affect the lifetime characteristic of the solar cell substrate and may cause photo-degradation.

DISCLOSURE OF THE INVENTION

The present invention has been accomplished to solve the above-mentioned problems, and an object of the present invention is to provide a silicon single crystal and a silicon single crystal wafer for producing a solar cell having very high conversion efficiency of optical energy that is not suffered from photo-degradation, even though it has high oxygen concentration, and also provide a method for producing them.

To achieve the above object, the present invention provides a silicon single crystal doped with Gallium wherein resistivity is 5Ω.cm to 0.1Ω.cm.

The present invention also provides a silicon single crystal doped with Ga wherein concentration of Ga in the crystal is $5 \times 10^{17}$ atoms/cm$^3$ to $3 \times 10^{15}$ atoms/cm$^3$.

Although the substrate of the solar cell is desired to be a substrate having low resistivity and long lifetime, in the substrate wafer having extremely low resistivity, the lifetime of minority carrier becomes shorter due to Auger recombination, resulting in lowering of conversion efficiency. Accordingly, the amount of Gallium contained in the silicon single crystal of the present invention is preferably such an amount that the resistivity is 0.1Ω.cm or more, more preferably 0.2Ω.cm or more. Alternatively, concentration of Gallium is preferably $5 \times 10^{17}$ atoms/cm$^3$ or less.

In the following description, the lifetime of such a carrier generated in the substrate is called substrate lifetime or lifetime.

On the other hand, too high resistivity of the substrate may also cause a problem. If the substrate resistivity gets high, electric power is consumed with internal resistance of the solar cell when it is processed to be a solar cell, so that conversion efficiency may also be lowered. For these reasons, if the wafer of the present invention is used as material for a substrate of a solar cell, it is preferable that the resistivity is 5Ω.cm or less, more preferably 2.0Ω.cm or less, or that gallium concentration in the single crystal ingot is $3 \times 10^{15}$ atoms/cm$^3$ or more.

The present invention also provides a silicon single crystal doped with gallium wherein concentration of interstitial oxygen in the single crystal is $20 \times 10^{17}$ atoms/cm$^3$ (ASTM'79) or less.

As described above, according to the present invention, if oxygen is contained in the crystal, photo-degradation can be prevented by Ga, so that oxygen concentration in the crystal can be as high as that in a general single crystal produced according to CZ method, especially can be high as $20 \times 10^{17}$ atoms/cm$^3$ or less. Accordingly, it is not necessary to make oxygen concentration low forcedly, so that there are advantages that the single crystal can be produced. easily, and that strength of the crystal is high since adequate amount of oxygen is contained therein.

The present invention also provides a silicon single crystal doped with Ga wherein a diameter of the single crystal is 4 inches or more.

In the case that a diameter of a single crystal used for a substrate is large, the crystal produced according to CZ method or MCZ method tends to have high oxygen concentration. Accordingly, if a solar cell having high conversion efficiency is to be produced, it has been a general way to produce a single crystal according to FZ method or to produce a single crystal having a small diameter according to MCZ method, in order to achieve low oxygen concentration. However, it is very difficult to produce a single crystal having a diameter of more than 6 inches according to FZ method, and it is also difficult to produce a single crystal having a diameter of more than 4 inches and low oxygen concentration according to MCZ method. Accordingly, it has been considered as inappropriate to produce a single crystal having a large diameter for production of a solar cell having high conversion efficiency.

However, according to the silicon single crystal of the present invention, even if oxygen concentration in the single crystal is high, stable substrate lifetime can be achieved as described above. Accordingly, a single crystal ingot having a large diameter as 16 inches or 20 inches, which is not used at present can be used as a substrate wafer of a solar cell, so that a solar cell having high conversion efficiency can be easily produced irrespective of the diameter of the single crystal ingot. Furthermore, since a wafer having a large diameter out of use at present can be used as a substrate of a solar cell, a solar cell itself can be made large, so that it is fully possible to find more use of a solar cell.

The present invention also provides a silicon single crystal wafer doped with gallium produced by slicing a silicon single crystal doped with gallium produced according to Czochralski method.

If the silicon single crystal wafer doped with gallium is used as a material for a substrate of a solar cell, shortening of the lifetime due to influence of oxygen contained in the crystal can be suppressed. Accordingly, even if the single crystal wafer has high oxygen concentration, a long lifetime that is necessary for a solar cell can be achieved. Thereby, a long lifetime can be achieved even in a cell having a low resistivity, and it has become possible to produce a solar cell wherein a substrate wafer having high oxygen concentration is used, but conversion efficiency is not low, and high performance can be achieved. Furthermore, since oxygen concentration in the wafer is appropriate, there can be achieved an advantage in use that a strength of the wafer is high.

In order to use the silicon single crystal wafer doped with gallium as a solar cell substrate, the resistivity is preferably 5Ω.cm to 0.1Ω.cm, and is more preferably 2.0Ω.cm to 0.2Ω.cm. Alternatively, Ga concentration in the wafer substrate is preferably $5 \times 10^{17}$ atoms/cm$^3$ to $3 \times 10^{15}$ atoms/cm$^3$, more preferably $1.5 \times 10^{17}$ atoms/cm$^3$ to $7 \times 10^{15}$ atoms/cm$^3$.

If a wafer having resistivity more than 5Ω.cm, or having Ga concentration smaller than $3 \times 10^{15}$ atoms/cm$^3$ is used as a substrate of a solar cell, resistivity of the wafer will be unnecessarily high, and an electric power is consumed with an internal resistance of the solar cell and conversion efficiency may be reduced, when the substrate is processed to be a solar cell. If a resistivity of the wafer is less than 0.1Ω.cm, or Ga concentration in the wafer is more than $5 \times 10^{17}$ atoms/cm$^3$, resistivity of substrate will be extremely reduce and, as a result, lifetime of minority carrier will be lowered due to Auger recombination, and conversion efficiency will be lowered. Accordingly, it is preferable that a wafer having resistivity of 5Ω.cm to 0.1Ω.cm, or has concentration of Gallium in the range of $5 \times 10^{17}$ atoms/cm$^3$ to $3 \times 10^{15}$ atoms/cm$^3$.

Interstitial oxygen concentration in the silicon single crystal wafer doped with Ga of the present invention is preferably $20 \times 10^{17}$ atoms/cm$^3$ (ASTM(79)) or less. Namely, it is acceptable in the case that oxygen concentration in the substrate of the solar cell doped with Ga is as that of a single crystal produced according to CZ method. Namely, a silicon wafer having oxygen concentration of a value incorporated in the crystal during the growth of single crystal, namely a value less than solid solubility of oxygen at a temperature around a melting point of silicon is suitable.

In order to obtain a silicon single crystal wafer having oxygen concentration more than $20 \times 10^{17}$ atoms/cm$^3$, a silicon single crystal ingot having so high oxygen concentration as to meet the necessity. In order to obtain a single crystal ingot having high oxygen concentration more than necessary, it is necessary to select the condition of production under which a single crystal ingot is hardly produced, for example, high speed of rotation of crucible during the growth of single crystal. Under such condition of crystal growth, slip dislocation may be generated in single crystal during the growth of the single crystal, or the crystal cannot be pulled straight, resulting in deformation of the crystal, so that some crystal cannot be processed to be a substrate of a solar cell. As a result, production cost of a wafer gets high, and economical merit is hardly obtained. Accordingly, oxygen concentration of a wafer used for the present invention is preferably $20 \times 10^{17}$ atoms/cm$^3$ or less.

As described above, the silicon single crystal doped with gallium and the silicon single crystal wafer doped with gallium of the present invention is especially useful for a solar cell.

The silicon single crystal solar cell produced using Ga doped silicon single crystal or Ga doped silicon single crystal wafer is inexpensive and has high energy conversion efficiency.

Namely, if Ga doped silicon single crystal ingot grown, for example, by CZ method is proc ssed to be a substrate for a solar cell, and a solar cell is produced using the wafer, a solar cell having stable conversion efficiency can be produced without being affected by concentration of oxygen incorporated in the crystal during the growth of the silicon crystal. If the Ga doped silicon single crystal is used as material for a solar cell, the substrate lifetime can be stable without being affected by concentration of oxygen, so that there can be produced a solar cell having high conversion efficiency even when resistivity of the solar cell is low.

In conventional boron doped single crystal, as the resistivity becomes lower, so the lifetime becomes shorter. Accordingly, a solar cell having high conversion efficiency and low resistivity could not be produced. However, using Ga doped silicon single crystal and silicon single crystal wafer of the present invention, a solar cell having high conversion efficiency can be produced.

In that case, the above-mentioned silicon single crystal solar cell can have an area of 100 cm$^3$ or more.

As described above, if Ga doped silicon single crystal according to CZ method is used as a substrate for a solar cell, a solar cell having high conversion efficiency, less lowering of conversion efficiency due to photo-degradation and large area can be produced at low production cost, so that cost of solar cell can be further reduced and increase of demand thereon may be expected. Furthermore, if the area is large, more electric current can be obtained from one cell, so that it is also effective for electric power.

Furthermore, the above-mentioned silicon single crystal solar cell has preferably conversion efficiency of 20% or more.

As described above, if Ga doped silicon single crystal is used as a substrate of a solar cell, a solar cell having high conversion efficiency and less lowering of conversion efficiency due to photo-degradation can be produced. In that case, conversion efficiency can be increased 20% or more. Especially, it should be pointed out that conventionally a solar cell having an area of 100 cm$^2$ or more and conversion efficiency of 20% or more could not be in practical use, however, according to the present invention, 20% or more of conversion efficiency can be achieved in the solar cell having the cell area of 100 cm$^2$ or more.

The silicon single crystal solar cell of the present invention can be for space use.

Since the silicon single crystal solar cell of the present invention is made of Ga doped single crystal, it is not susceptible to various radiation in space. Namely, rapid photo-degradation as observed in boron dope crystal is not observed. Accordingly, the silicon single crystal solar cell is suitable for space use.

The silicon single crystal solar cell described above may have a rate of lowering of conversion efficiency due to photo-degradation of 0.5% or less.

As described above, since the silicon single crystal solar cell of the present invention has high conversion efficiency and almost no lowering of conversion efficiency caused by photo-degradation, it is quite effective for a solar cell.

In the above description, "lowering of conversion efficiency due to photo-degradation" represents a value obtained by subtracting conversion efficiency after irradiation of steady-state irradiation with halogen lamp or the like used for solar simulator for 30 hours from conversion efficiency before the irradiation.

The present invention also provides a method for production of GA doped silicon single crystal according to CZ method wherein Ga is added in a silicon melt in a crucible, a seed crystal is brought into contact with the silicon melt and is pulled with rotating to grow a silicon single crystal ingot.

Thereby, Ga doped silicon single crystal can be produced.

In that case, addition of Ga to a melt in a crucible is preferably conducted by growing a silicon crystal ingot in which Ga of high concentration is added previously, and crashing the silicon single crystal doped with Ga in high concentration to prepare a doping agent, and adding Ga in a silicon melt using it.

As a method of doping Ga in the case that a single crystal in which Ga is added is produced according to the present invention, a method of adding gallium directly to silicon polycrystal before or after being melted can be used, but in the case that the single crystal doped with gallium is mass-produced for industrial purpose, it is preferable that the doping agent is previously prepared to use for doping as described above. If such a method is used, operation can be conducted efficiently. Because, gallium has a low melting point as 30° C., and is difficult to be handled. Accordingly, Ga concentration can be controlled accurately and easily not by adding gallium directly in a crucible, but by preparing a doping agent and doping with it, and an accurate dopant concentration can be achieved. Furthermore, a doping agent is easy to be handled, compared to the case that gallium is directly added in the silicon melt, so that operation efficiency can also be improved.

The number of rotation of a crucible during growing a Ga doped single crystal ingot can be 30 rpm or less.

An amount of oxygen eluted from a wall of a crucible can be controlled by changing the number of rotation of the crucible during growing a single crystal, and thereby an amount of oxygen incorporated in the single crystal to be grown can be controlled. However, even when Ga doped silicon single crystal is grown, the upper limit of the number of rotation of the crucible is 30 rpm, in light of ruffl of the liquid surface of the silicon melt or the like generated as a result of the vibration due to rotation of the crucible. Preferably the single crystal is grown with controlling the number of rotation of the crucible, depending on the intended oxygen concentration of the crystal to be pulled, in the range of 30 rpm or less. The upper limit of the number of rotation of the crucible is constant irrespective of the diameter of the single crystal to be pulled or the size of the crucible. Accordingly, if a single crystal is grown with controlling the number of rotation of the crucible in the range of 30 rpm or less, the single crystal can be grown efficiently without causing slip dislocation during the growth of the single crystal.

It is preferable that a pressure in a furnace of a pulling apparatus during the growth of Ga doped silicon single crystal is in the range of 10 to 500 mbar.

Oxygen eluted from a wall of a quartz crucible is always evaporated in the form of SiO from a surface of a silicon melt. Accordingly, in order to keep oxygen concentration in the silicon melt at a necessary value, a pressure in a chamber needs to be controlled appropriately. If the pressure in the furnace is 10 mbar or lower, extremely much amount of SiO is evaporated from the silicon melt, and an amount of oxygen eluted from the quartz crucible is increased, resulting in acceleration of degradation of the wall of the quartz crucible, so that the quartz crucible cannot stand against a long period of operation. Therefore, such a low pressure is not preferable. If the pressure is 500 mbar or more, SiO evaporated from the silicon melt is liable to adhered in the chamber, which may prevent growth of single crystal. Accordingly, unnecessarily high pressure is not preferable. It is preferable to decide a pressure in the furnace selected in the range of 10 to 500 mbar depending on the intended quality of the single crystal ingot to be produced, when Ga doped silicon single crystal ingot is grown.

An amount of inert gas to be flown in a furnace of a pulling apparatus during growing Ga doped silicon single crystal is preferably in the range of 10 to 500 l/min.

If the amount of inert gas flown above the liquid surface of melt is more than 500 l/min, an amount of SiO removed from the surface of the silicon melt is increased, resulting in acceleration of degradation of the wall of the quartz crucible. Furthermore, if a large amount of inert gas is brought into contact with the surface of the silicon melt, ruffle of the melt is enlarged, resulting in inhibiting growth of the single crystal ingot, which may lead to a problem that a single crystal cannot be pulled. If an amount of inert gas is less than 10 l/min, effect of removing SiO evaporated from the surface of the melt is lowered, there may be generated problems that cause dislocation generation during growing single crystal, for example, oxides of silicon may be precipitated on the upper part of the crucible. For these reasons, an amount of inert gas during growing single crystal is preferably controlled in the range of 10 to 500 l/min depending on intended quality of crystal.

It is preferable that the inert gas flown in the furnace of the pulling apparatus during growing Ga doped silicon single crystal is argon.

If argon is used as the inert gas flown in the furnace of the pulling apparatus during glowing the single crystal, any degradation of quality as will be problem in the solar cell is not caused, when the single crystal ingot is processed to be the solar cell, so that the substrate wafer having a stable quality can be produced, since Ar is chemically stable and does not affect the quality of the single crystal that is grown.

If the silicon single crystal and silicon single crystal wafer produced by Czochralski method is doped with Ga according to the present invention, photo-degradation is not caused even in the case that the single crystal having high oxygen concentration is produced, so that silicon single crystal and silicon single crystal wafer for producing a solar cell having very high conversion efficiency of optical energy can be produced. Besides, the present invention facilitates manufacture of these products with a large diameter, sufficient strength of crystal and excellent durability.

BEST MODE FOR CARRYING OUT THE INVENTION

The present invention will now be described in more detail. However, the invention is not limited thereto.

The inventors have studied the condition for obtaining a substrate of a solar cell that can be produced with relative ease and can be mass-produced, and at the same time have a high conversion efficiency as material for a substrate of a solar cell, and made experiments therefor repeatedly and studied further, and have accomplished the present invention.

Namely, the inventors have found that since oxygen and boron exist at the same time in crystal in the solar cell produced using a conventional P type silicon single crystal doped with boron as a dopant produced by CZ method, deep level (also called trap level) due to oxygen and boron is formed in a bulk of the solar cell, and carrier in the solar cell is trapped in the deep level, resulting in shortening of substrate lifetime and photo-degradation, and have noted that the substrate lifetime is shorten only when both oxygen and boron exist at the same time, and the lifetime is not changed and photo-degradation is not caused when only one of oxygen and boron exists, and have completed the present invention.

As a substrate of a solar cell, P type silicon single crystal wafer has been mainly used. The inventors have considered that if P type silicon single crystal can be produced using other elements than boron, substrate lifetime is not shortened even when oxygen exists in the crystal, and a solar cell wherein less photo-degradation is caused can be produced, and have made experiments repeatedly. Then, they have confirmed that there can be produced a solar cell wherein lifetime is always stable and photo-degradation is not caused even when high concentration of oxygen exists in crystal, by using the substrate produced by pulling P type silicon single crystal with adding gallium as a dopant.

However, as described above, if the wafer resistivity is more than 5Ω.cm, the resistivity is unnecessarily high, and electric power is consumed by the internal resistance of the solar cell so that conversion efficiency may also be lowered. If the resistivity is less than 0.1Ω.cm, the substrate resistivity is extremely low, and shortening of lifetime of minority carrier is caused in the substrate due to Auger recombination, resulting in lowering of conversion efficiency of cell as well. Accordingly, it has been confirmed that it is preferable to use a wafer having a resistivity of 5Ω.cm to 0.1Ω.cm, more preferably 2.0Ω.cm to 0.2Ω.cm, or a wafer having concentration of Gallium of $5 \times 10^{17}$ atoms/$cm^3$ to $3 \times 10^{15}$ atoms/$cm^3$, more preferably $1.5 \times 10^{17}$ atoms/$cm^3$ to $7 \times 10^{15}$ atoms/$cm^3$, as a substrate of a solar cell.

Thereby, there can be produced a solar cell wherein photo-degradation is not caused, a conversion efficiency is stably high even when it is produced using a silicon single crystal produced by CZ method having high oxygen concentration, and cost of power generation by a silicon single crystal solar cell can be reduced. As a result, the problem of cost of silicon raw material for the solar cell can be solved, and propagation of photovolataic generation that is clean energy can be achieved after melting polycrystalline silicon.

Since a stable conversion efficiency can be achieved irrespective of oxygen concentration even in a single crystal produced by CZ method, a wafer having larger diameter than that of a conventional wafer can be used as a substrate. Since a conventional single crystal doped with boron having a large diameter contains high concentration of oxygen, photo-degradation of the substrate of the solar cell is caused. However, if single crystal doped with gallium in an appropriate amount so that a resistivity may be $5\Omega.cm$ to $0.1\Omega.cm$ is used, high conversion efficiency can be achieved irrespective of oxygen concentration even in the single crystal substrate having a large diameter, so that a larger solar cell can be developed in future. Furthermore, oxygen is contained in an appropriate amount, strength of the crystal is high, good workability can be achieved, and durability of the resultant solar cell can be improved.

Furthermore, since it is generally necessary to take out a certain electric voltage or electric current from a solar cell for a long time, solar cells are connected in series or in parallel to be modularized so that intended electric power can be output for practical use. In order to take out especially large electric power, a lot of solar cells should be connected. Accordingly, a solar cell having larger area is more advantageous in order to achieve simplification of a solar cell module, downsizing, and reduction of production cost. If a solar cell having a large size and high conversion efficiency can be used as material of solar cell module, further reduction in cost of a solar cell and increase of demand thereon can be achieved.

However, it was conventionally difficult to obtain a solar cell having characteristics matching for production cost of a silicon single crystal having a large diameter, since conversion efficiency of solar cell energy of the solar cell using CZ silicon single crystal was originally low, and a conversion efficiency was lowered due to photo-degradation caused by influence of oxygen and boron contained in the crystal, even when a silicon single crystal having a large diameter is used as a solar cell. substrate.

On the other hand, if the silicon single crystal doped with gallium in an adequate amount so that a resistivity may be $5\Omega.cm$ to $0.1\Omega.cm$ is used as a substrate of a solar cell, a solar cell wherein lowering of conversion efficiency due to photo-degradation is little and conversion efficiency is high, and silicon single crystal having a large diameter can be produced according to CZ method. Thereby, a large solar cell such as those having an area of $100 cm^2$ or more can be mass-produced at low cost. By such an advantage, and characteristics that photo-degradation is hardly caused and conversion efficiency is high, further reduction in cost of a solar cell and increase of demand thereon can be expected.

Embodiments of the present invention will now be described in detail.

Figure 1:
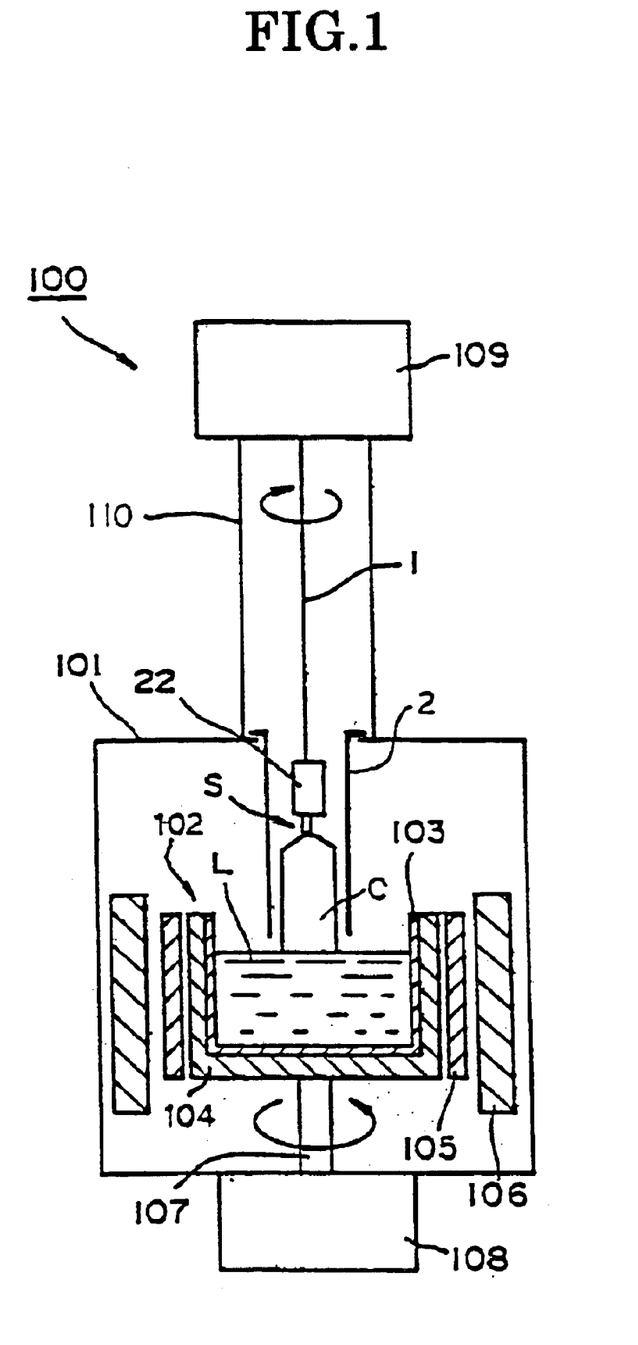
FIG. 1 is a structural drawing of an example of apparatus for pulling single crystal by CZ method used for the present invention.

First, one example of constitution of an apparatus for pulling single crystal according to CZ method used in the present invention will be shown referring to FIG. 1.

The apparatus 100 for pulling single crystal comprises a bottom chamber 101 including a crucible 102 for melting raw material and a top chamber 110 in which a pulled single crystal is put and from which it is taken out. At the upper part of the top chamber 110, there is equipped with a wire winding mechanism 109 for pulling a single crystal, which is operated so that a wire 1 may be wound up and down with growing of single crystal. At the tip end of the wire 1, seed crystal S is attached to a seed holder 22 for pulling the silicon single crystal.

The crucible 102 in the bottom chamber 101 comprises go an inner part 103 made of quartz and an outer part 104 made of graphite. A heater 105 for melting polycrystal silicon raw material charged in the crucible is disposed around the crucible 102. A heat insulating material 106 is disposed around the heater 105. The crucible 102 is filled with silicon melt L melted by heating with the heater. The crucible is supported with a supporting shaft 107 for rotating and moving vertically the crucible 102 and a driving apparatus 108 therefor is attached at a lower part of the bottom chamber. A gas flow-guide cylinder 2 can also be provided in order to straighten an inert gas introduced in the furnace.

Next will be described a method for producing a silicon single crystal using the above-mentioned apparatus. First, polycrystalline silicon raw material and Ga as a dopant are charged in the quartz crucible 103, and heated with the heater 105 to melt the raw material. In this embodiment, Ga is charged together with the polycrystalline raw material in the crucible before melting. However, since accurate control of concentration is necessary in the case of mass production, it is preferable that a silicon single crystal doped with Ga in high concentration is produced, and is crushed finely to prepare a doping agent, which is then charged in polycrystalline silicon with controlling an amount of addition thereof so that a desired concentration thereof may be achieved after melting polycrystalline silicon.

Then, after the polycrystalline silicon raw material is completely melted, the seed crystal S for growing a single crystal ingot is attached at the end of the wire 1 of the pulling apparatus, and the wire 1 is winding down quietly so that the tip end of the seed crystal may be brought into contact with the silicon melt L. In that time, the crucible 102 and the seed crystal S rotate to a different direction from each other. Space in the pulling apparatus is under a reduced pressure, and is filled with inert gas such as argon or the like flown from the upper part of the furnace.

When the temperature around the seed crystal gets stable, the wire 1 is wound up quietly with rotating the seed crystal S and the crucible 102 to a different direction from each other, and thereby pulling of the seed crystal is initiated. Then, necking operation is initiated in order to eliminate slip dislocation generated in the seed crystal. When the necking operation is continued to the thickness or length at which slip dislocation is eliminated, pulling is conducted so that the diameter of the crystal may get large gradually to form a cone part of the single crystal, with increasing the diameter to a desired value. When the diameter of the cone part becomes a predetermined value, formation of a constant diameter part (a body) of the single crystal ingot is initiated. A rotation rate of the crucible, a pulling rate, inert gas pressure in the chamber, a flow amount or the like in that time are controlled appropriately depending on oxygen concentration in the single crystal to be grown. The diameter of the crystal can be controlled by adjusting the temperature and the pulling rate.

After a body of the crystal is pulled to the predetermined length, a tail part is formed by decreasing a diameter of the crystal, and then the tip end of the tail is cut off from the surface of the silicon melt, and the grown silicon single crystal is lifted to the top chamber 110 by winding up the wire, and allowed to be cooled. When the single crystal ingot is cooled so that it may be taken out, it is taken out from the pulling apparatus. Then, the step of processing the crystal to be a wafer is conducted.

In the processing step, the cone part and the tail part are cut off first, the single crystal ingot is then subjected to cylindrical grinding and cut to blocks having an appropriate size. Then, the single crystal block having an appropriate size is sliced with a slicer to be in a shape of a wafer. Then, it is subjected to processes such as chamfer, lapping, or the like, if necessary, and a mechanical damage is removed by etching. Thereby, a wafer as a substrate of the solar cell is produced. At the same time, a sample wafer for measuring a substrate lifetime is cut off, and the lifetime is measured. The method for measuring the substrate lifetime is as follows.

1. A method for measuring substrate lifetime

1) A substrate for measurement: a wafer having a thickness of 2 to 3 mm or a thickness of 250 to 400 $\mu$m 2) Pretreatment condition: a slice wafer is treated with a mixed acid of $HF:HNO_3=5\%:95\%$, thereby a damage layer on both surface thereof is removed by etching, cleaned, and then the surface of the wafer is irradiated with fixed light under the condition of AM (Air Mass) 1.5 for 30 hours, and the natural oxide film on the surface is removed with HF. Subsequently, Chemical passivation (CP) treatment is conducted using a mixed solution of iodine and ethanol to reduce carrier recombination at crystal surface.

3) Method for measuring lifetime: micro wave—PCD method (photo conductivity decay method) is used to measure the substrate lifetime.

Furthermore, more than one wafers are sliced from the same crystal as that used for the above-mentioned measurement, and RP-PERC (Random Pyramid—Passivated Emitter and Rear Cell) type solar cell having high conversion efficiency is fabricated. Then, a measurement of conversion efficiency of the solar cell was conducted. A method for measurement of the conversion efficiency is as follows.

2. A method for measuring conversion efficiency of solar cell

1) Shape of cell: RP-PERC type cell

2) Method for measuring: The solar cell is placed on the table for measurement of which temperature is controlled to be 25° C., and irradiated with fixed light under the condition of AM (air mass) 1.5 using a solar simulator equipped with a halogen lamp as a light source. The electric voltage and the electric current taken out from the cell are measured, and a conversion efficiency of the solar cell is calculated therefrom. The conversion efficiency means a value defined by the following equation in the present invention.

[Conversion efficiency]=[taken out electric power per unit cell area]/[optical energy of irradiation per unit cell area]×100%.

3. A method for measuring resistivity

Th resistivity was measured by cutting out a certain sample from the single crystal, subjecting it to a donor annihilation heat treatment in a nitrogen atmosphere at 650° C. for 20 minutes, and conducting measurement according to a four point probe method.

EXAMPLES

The following examples and comparative examples are being submitted to further explain the present invention. These examples are not intended to limit the scope of the present invention.

Example 1

In accordance with CZ method, a silicon single crystal ingot doped with Ga was produced according to Czochralski method.

0.167 g of Ga was weighed and charged in a quartz crucible together with polycrystalline silicon raw material. The amount of the polycrystalline silicon raw material charged in the crucible was 20 kg. Then, the raw material was melted by increasing the temperature of the heater. When all of the raw material was melted, the seed crystal was brought into contact with the surface of the melt and lifted up with being rotated. Thereby P type single crystal ingot having a diameter of 4 inches was produced. The crucible having an opening with a diameter of 12 inches was used at that time.

The main production condition of the single crystal ingot was as follows.

Pulling rate: gradually lowered to 1.5 to 0.9 mm/min

Rotation number per minute of crucible: changed in the range of 9 to 21 rpm

Atmospheric gas in furnace: argon gas was flown from the upper part of the chamber to a direction of a surface of a melt at 20 l/min.

Pressure in the furnace: pressure in the chamber was 20 mbar.

With the above-mentioned production method and production condition, Ga doped silicon single crystal ingots having a crystal diameter of 4 inches and a pulled weight of 18 kg of P conductive type and orientation <100> was pulled.

Figure 2:
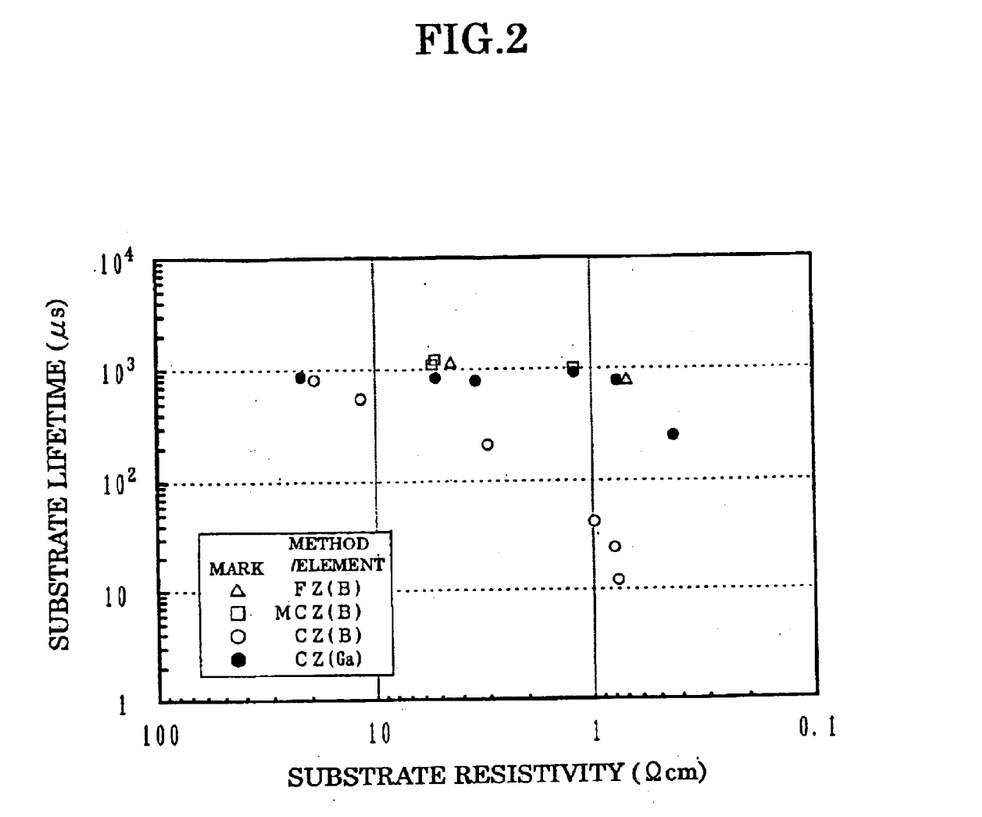
FIG. 2 is a graph showing a relation between a substrate resistivity and a substrate lifetime.

Three crystals were pulled under the same condition, and oxygen concentration, resistivity, and substrate lifetime were measured. The oxygen concentration was high as 15 to $16\times10^{17}$ atoms/$cm^3$. The resistivity and the substrate lifetime were as shown in FIG. 2 (black circle plots). The doping amount of Ga was 0.167 g for one of three crystals. The doping amount in other two crystals was changed, so that the resistivity of the three crystals may be in the range about 20 to 0.5Ω.cm.

As shown in FIG. 2, when the oxygen concentration in the crystal was high in the substrate doped with Ga, the resistivity was lowered, but there is almost no shortening of the substrate lifetime. Accordingly, it was confirmed that the characteristic was stable.

The sample having low resistivity was chosen from the samples used above, and a solar cell having a thickness of 250 $\mu$m and a size of 2×2 cm was produced. The conversion efficiency was measured. The results were shown in Table 1.

As shown in Table 1, even though the wafer having high oxygen concentration was used, the conversion efficiency was high as 21.1%, which means that optical energy was converted to electric energy. There was almost no change in conversion efficiency after the solar cell was irradiated for 30 hours or more, namely the conversion efficiency was 21.1% that is the same as the initial value, and it was stable. It was therefore confirmed that the solar cell produced using the substrate doped with Ga has good characteristic equivalent to that of the solar cell produced using the substrate having low oxygen concentration according to FZ method or MCZ method, even though it has high oxygen concentration in the substrate.

TABLE 1

| Method for Production | Element (Dopant) | Oxygen Concentration ASTM'79 × $10^{17}$ atoms/cm$^3$ | Resistivity Ω·cm | Cell area | conversion efficiency Before photo-degradation (%) | conversion efficiency After photo-degradation (%) |
|---|---|---|---|---|---|---|
| Example 1 | CZ method | Ga | 15.2 | 3.4 | 2 cm × 2 cm | 21.1 |
| Example 2 | | | 15.2 | 0.4 | 10 cm × 10 cm | 20.2 |
| Comparative Example 1 | | B | 10.4 | 0.8 | 2 cm × 2 cm | 20.5 | 18.7 |
| Comparative Example 4 | | | 10.4 | 0.8 | 10 cm × 10 cm | 19.8 | 17.9 |
| Comparative Example 2 | MCZ method | B | 1.20 | 1.2 | 2 cm × 2 cm | 20.7 |
| Comparative Example 3 | FZ method | B | 0.08 | 4.4 | 2 cm × 2 cm | 21.0 |

Example 2

In order to confirm that a large sized solar cell that can be used can be actually produced using a silicon single crystal substrate doped with Ga, CZ silicon single crystal doped with Ga having a diameter of 6 inches was grown using a quartz crucible having an opening with a diameter of 18 inches, and a substrate to be a solar cell was produced using the single crystal.

A solar cell having a size of 10×10 cm (cell area of 100 cm$^2$) and a thickness of 250 μm that was large as a silicon single crystal solar cell, and the conversion efficiency thereof was measured. The results of the measurement was shown in Table 1.

As shown in Table 1, there was almost no difference in conversion efficiency before and after the solar cell was irradiated with fixed light for 30 hours, and photo-degradation is hardly caused. The conversion efficiency was 20.2% that is quite excellent value. Namely, it was confirmed that a large size solar cell having high efficiency could be produced.

Example 3

More than one CZ silicon single crystals doped with Ga having a diameter of 6 inches were grown as in Example 2. More than one wafers were cut out from the part having high Ga concentration and the substrate resistivity of 1.30Ω.cm or less, and the substrate lifetime was measured. The results were shown in FIG. 3.

Figure 3:
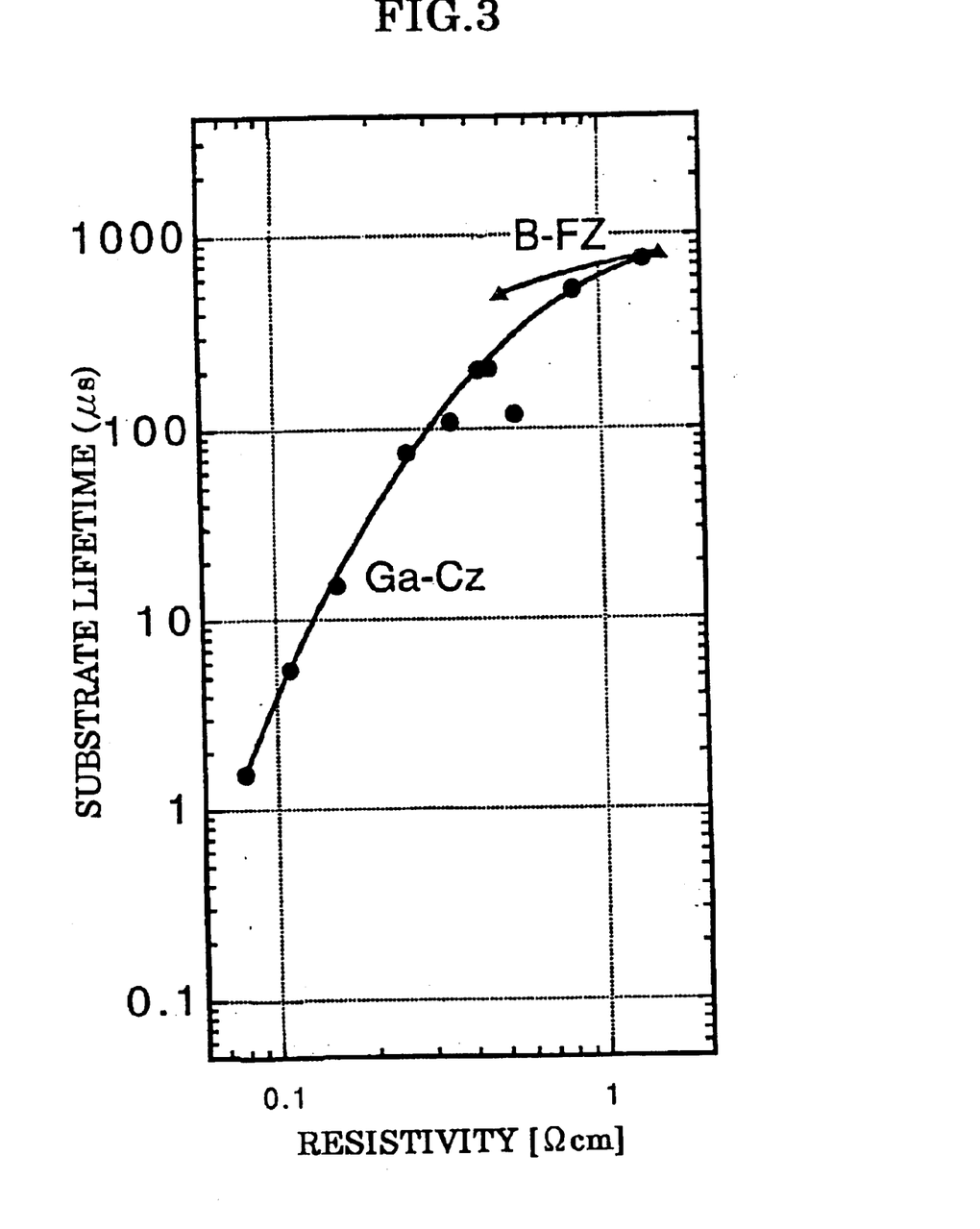
FIG. 3 is a graph showing a relation between a substrate resistivity and a substrate lifetime at a low resistivity.

As shown in FIG. 3, in the crystal doped with gallium, lowering of the life time was little, even when the resistivity was low.

More than one wafers (having a thickness of 380 μm) were cut out from a part where the resistivity of the substrate was 0.08Ω.cm to 10Ω.cm, and a solar cell having a size of 2 cm×2 cm was produced, and a conversion efficiency was measured. The results were shown in FIG. 4.

Figure 4:
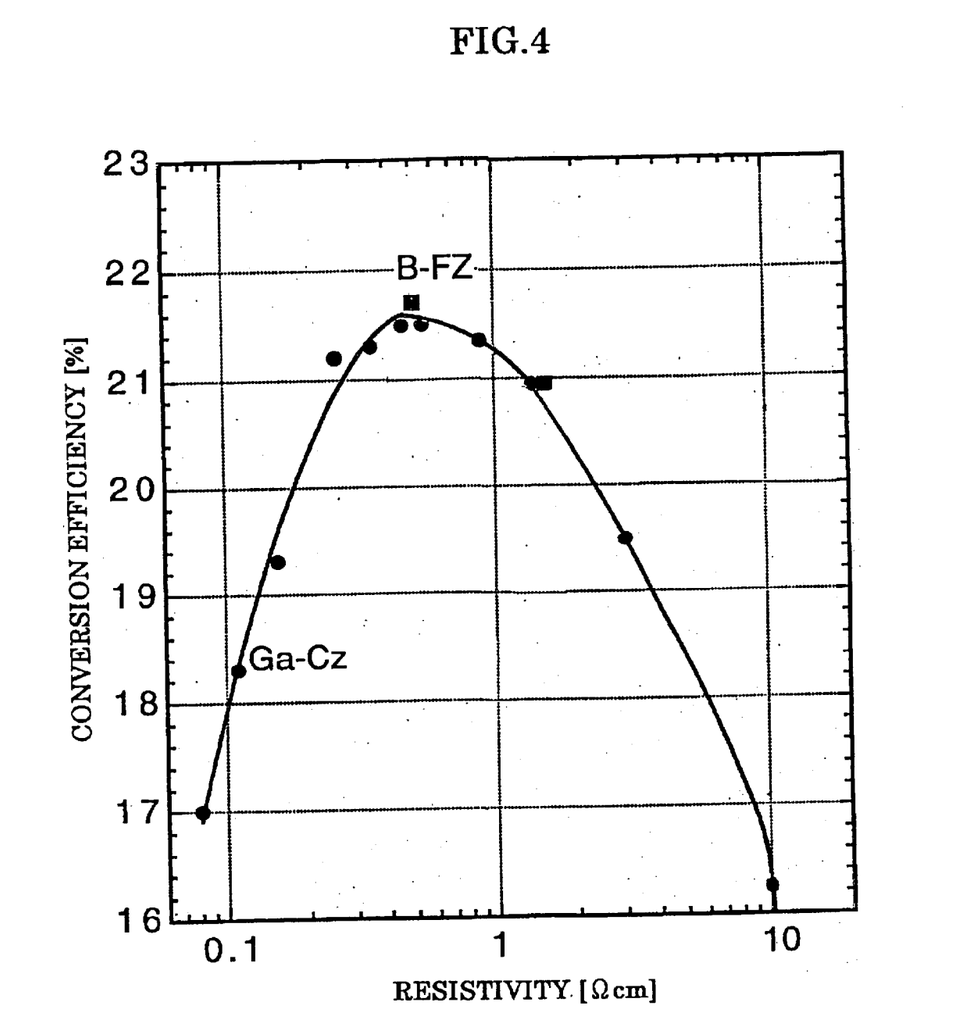
FIG. 4 is graph showing a relation between a substrate resistivity and a conversion efficiency of a solar cell produced using the substrate.

As shown in FIG. 4, the solar cell produced using the crystal having a resistivity 0.1Ω.cm to 5Ω.cm had relatively high conversion efficiency. Especially, the solar cell having 0.2Ω.cm to 2Ω.cm had high conversion efficiency as about 20% or more.

Figure 5:
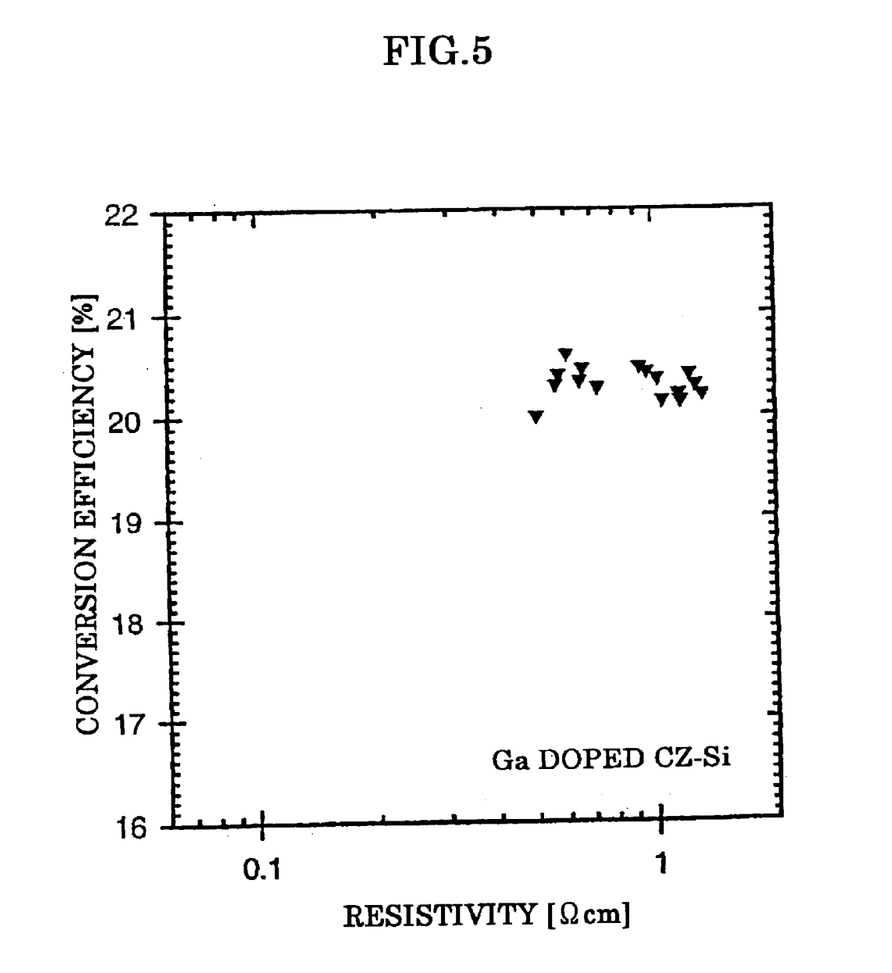
FIG. 5 is a graph showing a relation between a substrate resistivity and conversion efficiency of a solar cell having a large area produced using the substrate.

Furthermore, more than one wafers having a thickness of 380 μm were cut out from the part where the resistivity of the substrate was 0.5Ω.cm to 1.3Ω.cm to produce solar cells having a size of 10 cm×10 cm, and the conversion efficiency was measured. The results were shown in FIG. 5. High conversion efficiency of 20% or more could be achieved even in the solar cell having a large area. There is no lowering of conversion efficiency even when these solar cell was irradiated with fixed light for 30 hours or more.

Example 4

A wafer was cut out from the part where the resistivity was about 1Ω.cm of the CZ crystal doped with gallium used in Example 1, and the wafer was irradiated with 1 MeV electron beam at 3×10$^{16}$/cm$^2$, and then DLTS (Deep Level Transient Spectroscopy) was measured.

Figure 6:
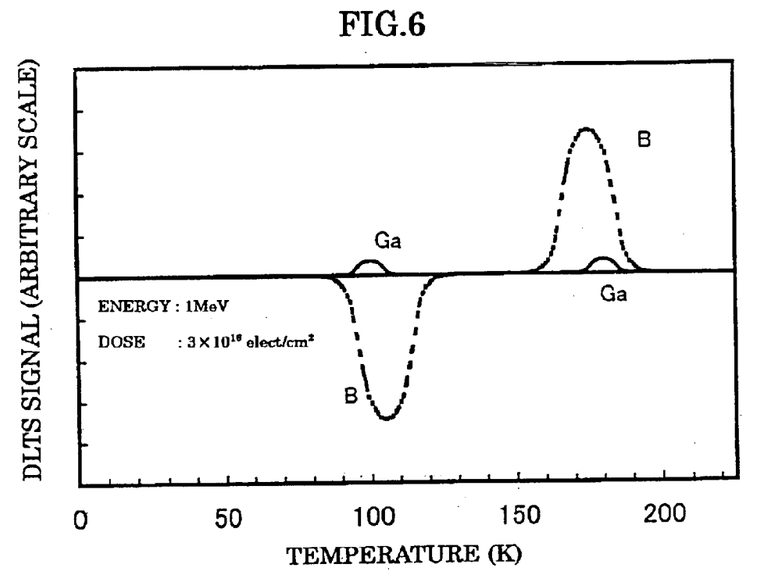
FIG. 6 is a graph showing a result of DLTS measurement.

The results of DLTS measurement was shown in FIG. 6. As shown in FIG. 6, almost no generation of donor represented by a peak near 100 to 110 K was observed in the crystal doped with gallium (shown in a solid line). Furthermore, only slight amount of recombination center that may cause shortening of lifetime represented by a peak around 175 k was observed in the crystal doped with gallium.

A solar cell was produced using a wafer (thickness of 250 μm and size of 2×2 cm) cut out from a part near the crystal where DLTS was measured, and irradiated with 1 MeV electron beam. The rate of decrease in electric current to dose of the electron beam was measured. The results were shown in FIG. 7.

Figure 7:
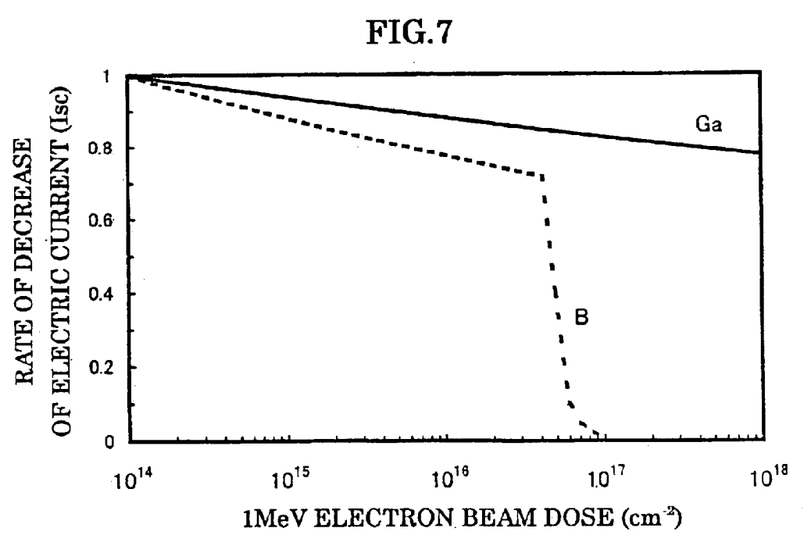
FIG. 7 is a graph showing a relation between a dose of electric beam and a rate of decrease of electric current in a solar cell.

As shown in FIG. 7, decrease in electric current was small in the crystal doped with gallium. Namely, when the dose was 1×10$^{18}$/cm$^2$, the electric current was only about 20% decreased. It was confirmed that the solar cell produced using a crystal doped with gallium had less degradation due to electron beam irradiation, and was suitable as a solar cell for space use.

Then, for comparison with the above Examples, the solar cells were produced using a substrate doped with boron produced respectively by FZ method, MCZ method and CZ method that are general material for a solar cell, and they were compared with the solar cells produced using the substrate doped with Ga.

Comparative Example 1

Silicon Single Crystal Doped with Boron Produced According to CZ Method

According to a general CZ method, six single crystal ingots having a diameter of 4 inches were pulled under the condition of low oxygen concentration so that resistivity may be in the range of about 20Ω.cm to about 0.8Ω.cm. The oxygen concentration, the resistivity, the substrate lifetime were measured. The oxygen concentration was in the range of 10 to 15×10$^{17}$ atoms/cm$^3$. The resistivity and the substrate lifetime were as shown in FIG. 2 (white circle plots).

A solar cell having a size of 2×2 cm$^2$ and a thickness of 250 μm was produced using the wafer having the lowest oxygen concentration and the lowest resistivity among them, and the conversion efficiency was measured before and after irradiation. The results of measurement were shown in Table 1.

As shown in Table 1, the power generation efficiency was lowered due to photo-degradation about 1.8% in the solar cell produced using the substrate doped with boron according to CZ method, even though oxygen concentration was low. It was confirmed that it was difficult to produce a solar cell having high conversion efficiency and stable properties.

Comparative Example 2

Silicon Single Crystal Doped with Boron Produced According to MCZ Method

According to a MCZ method, three single crystal ingots having a diameter of 4 inches were pulled under the condition of extremely low oxygen concentration. The oxygen concentration, the resistivity, the substrate lifetime were measured. The oxygen concentration was quite low as 1.0 to 1.8×10$^{17}$ atoms/cm$^3$. The resistivity and the substrate lifetime were as shown in FIG. 2 (white square plots).

A solar cell having a size of 2×2 cm and a thickness of 250 μm was produced using the wafer having the lowest oxygen concentration and the lowest resistivity among them, and the conversion efficiency was measured before and after irradiation. The results of measurement was shown in Table 1.

As shown in Table 1, there was almost no photo-degradation in the solar cell produced using the substrate doped with boron according to MCZ method, since oxygen concentration was extremely low therein. However, since it was produced at extremely low oxygen concentration according to MCZ method, cost is extremely high. It was also confirmed that photo-degradation was caused at high oxygen concentration, when MCZ is used.

Comparative Example 3

Silicon Single Crystal Doped with Boron Produced According to FZ Method

According to FZ method, two single crystal ingots having a diameter of 4 inches were pulled. The oxygen concentration, the resistivity, the substrate lifetime were measured. There was almost no oxygen contained therein, namely oxygen concentration was 0.1×10$^{17}$ atoms/cm$^3$ or less. The resistivity and the substrate lifetime were as shown in FIG. 2 (triangle plots).

A solar cell having a size of 2×2 cm$^2$ and a thickness of 250 μm was produced using one of the ingots, and the conversion efficiency was,measured before and after irradiation. The results of measurement was shown in Table 1.

As shown in Table 1, there was almost no photo-degradation in the solar cell produced using the substrate doped with boron according to FZ method, since there was almost no oxygen contained therein. However, the cost was extremely high, and it was difficult to produce those having a large diameter. Furthermore, the crystal strength was low and there was a problem in durability.

Comparative Example 4

A Large Cell Produced Using CZ Silicon Single Crystal Doped with Boron

A silicon single crystal having a diameter of 6 inches was produced according to general CZ method as in Example 2 except that it was doped with boron in place of gallium. A solar cell having a size of 10×10 cm and a thickness of 250 μm was produced using the silicon single crystal, and the conversion efficiency was measured. The results of measurement was shown in Table 1.

As shown in Table 1, the conversion efficiency of the solar cell produced as a large cell using a substrate doped with boron produced CZ method was relatively high as 19.8% before photo-degradation. However, after irradiation with fixed light for 30 hours, the conversion efficiency was lowered to 17.9% due to photo-degradation. Accordingly, stable conversion efficiency more than 20% cannot be obtained.

Comparative Example 5

For comparison with Example 4, a wafer was cut out from the CZ crystal doped with boron used in Comparative Example 1, and the wafer was irradiated with 1 MeV electron beam at 3×10$^{16}$/cm$^2$, and then DLTS was measured.

The results of DLTS measurement was shown in FIG. 6. As shown in FIG. 6, generation of donor represented by a peak near 100 to 110 K was observed in the crystal doped with boron (shown in a broken line). Furthermore, recombination center that may cause shortening of lifetime was generated at high density around 175 k in the crystal doped with boron.

A solar cell was produced using a wafer (thickness of 250 μm and size of 2×2 cm) cut out from a part near the crystal where DLTS was measured, irradiated with 1 MeV electron beam, and the rate of decrease in electric current to the dose of the electron beam was determined. The results were shown in FIG. 7.

As shown in FIG. 7, decrease in electric current was observed in the crystal doped with boron with increase of dose, the electric current was rapidly decreased and electric generation was stopped at dose of 5×10$^{16}$ cm$^2$. It can be considered that it was caused, since the lifetime gets short due to formation of deep level that becomes a carrier recombination center, and furthermore, defects due to oxygen and boron induce generation of donor, and p type crystal changes to n type with increase of donor concentration, resulting in stop of electric generation.

The present invention is not limited to the above-described embodiment. The above-described embodiment is a mere example, and those having the substantially same structure as that described in the appended claims and providing the similar action and effects are included in the scope of the present invention.

For example, in the above-described embodiment, there was mainly explained as for the case that the silicon single crystal doped with Ga was produced according to a general Czochralski method. However, the present invention can also be applied to MCZ method. The term "a Czochralski method" described in Claims of the present invention includes not only general Czochralski method but also MCZ method. Namely, doping of Ga according to the present invention is also effective in MCZ method in order to produce a silicon single crystal having a large diameter and high concentration.

What is claimed is:

1. A silicon single crystal produced according to Czochralski method using a melt in contact with a quartz crucible, to which Ga (gallium) is added as a dopant that controls resistivity of the crystal in a range of 5Ω.cm to 0.1Ω.cm, wherein a diameter of the single crystal is 4 inches or more, and the single crystal is used for a solar cell.

2. The silicon single crystal to which Ga is added according to claim 1, wherein concentration of interstitial oxygen in the silicon single crystal is $20 \times 10^{17}$ atoms/cm$^3$ (ASTM'79) or less.

3. The silicon single crystal to which Ga is added as a dopant that controls resistivity of the crystal according to claim 1, wherein the resistivity of the silicon single crystal is 5Ω.cm to 0.2Ω.cm.

4. A silicon single crystal wafer produced according to the Czochralski method to which Ga is added as a dopant that controls resistivity of the crystal, wherein the silicon single crystal wafer is produced by slicing the silicon single crystal according to claim 1.

5. A silicon single crystal solar cell produced using the silicon single crystal wafer to which Ga is added as a dopant that controls resistivity of the crystal according to claim 4.

6. A silicon single crystal solar cell produced using the silicon single crystal to which Ga is added as a dopant that controls resistivity of the crystal according to claim 1.

7. The silicon single crystal solar cell according to claim 6, wherein loss of overall conversion efficiency due to photo-degradation is 0.5% or less.

8. The silicon single crystal solar cell according to claim 6, wherein the silicon single crystal solar cell is for space use.

9. The silicon single crystal solar cell according to claim 8, wherein loss of overall conversion efficiency due to photo-degradation is 0.5% or less.

10. The silicon single crystal solar cell according to claim 6, wherein a conversion efficiency is 20% or more.

11. The silicon single crystal solar cell according to claim 10, wherein loss of overall conversion efficiency due to photo-degradation is 0.5% or less.

12. The silicon single crystal solar cell according to claim 6, wherein the area of the solar cell is 100 cm$^2$ or more.

13. The silicon single crystal solar cell according to claim 12, wherein a conversion efficiency is 20% or more.

14. The silicon single crystal solar cell according to claim 12, wherein loss of overall conversion efficiency due to photo-degradation is 0.5% or less.

15. A process for generating photovoltaic energy, comprising subjecting the silicon single crystal solar cell according to claim 12 to light irradiation in air.

16. A process for generating photovoltaic energy, comprising subjecting the silicon single crystal solar cell according to claim 6 to light irradiation in air.

17. A silicon single crystal produced according to Czochralski method using a melt in contact with a quartz crucible, to which Ga is added as a dopant that controls resistivity of the crystal, wherein concentration of Ga in the crystal is $5 \times 10^{17}$ atoms/cm$^3$ to $3 \times 10^{15}$ atoms/cm$^3$, a diameter of the single crystal is 4 inches or more, and the silicon single crystal is used for a solar cell.

18. The silicon single crystal to which Ga is added as a dopant that controls resistivity of the crystal according to claim 17, wherein the resistivity of the silicon single crystal is 5Ω.cm to 0.2Ω.cm.

19. A process for generating photovoltaic energy, comprising processing the silicon single crystal according to claim 17 to produce a solar cell and subjecting the solar cell to light irradiation in air.

20. A method for production of silicon single crystal to which Ga is added according to Czochralski method as a dopant that controls resistivity of the crystal, wherein Ga is added in a silicon melt in contact with quartz crucible, a seed crystal is brought into contact with the silicon melt and is pulled with rotation to grow a silicon single crystal ingot having resistivity controlled by the Ga in a range of 5Ω.cm to 0.1Ω.cm and having a diameter of 4 inches or more used for a solar cell.

21. The method for production of silicon single crystal to which Ga is added as a dopant that controls resistivity of the crystal according to claim 20, wherein addition of Ga to a melt in contact with the quartz crucible is conducted by growing a silicon crystal ingot in which Ga of high concentration is added previously, and crushing the silicon crystal ingot to prepare a doping agent, and adding Ga in the silicon melt using the doping agent.

22. The method for production of silicon single crystal to which Ga is added as a dopant that controls resistivity of the crystal according to claim 20, wherein the rate of rotation of the quartz crucible while the silicon single crystal ingot is grown is 30 rpm or less.

23. The method for production of silicon single crystal to which Ga is added as a dopant that controls resistivity of the crystal according to claim 20, wherein a pressure in a furnace of a pulling apparatus while the silicon single crystal is grown is in the range of 10 to 500 mbar.

24. The method for production of silicon single crystal to which Ga is added as a dopant that controls resistivity of the crystal according to claim 20, wherein a flow of inert gas in a furnace of a pulling apparatus while the silicon single crystal is grown is in the range of 10 to 500 l/min.

25. The method for production of silicon single crystal to which Ga is added as a dopant that controls resistivity of the crystal according to claim 20, wherein an inert gas flown in the furnace of the pulling apparatus while the silicon single crystal is grown is argon.

26. The method for production of silicon single crystal to which Ga is added as a dopant that controls resistivity of the crystal according to claim 20, wherein the resistivity of the silicon single crystal is 5Ω.cm to 0.2Ω.cm.

27. A method for producing a solar cell comprising:
making a solar cell from a wafer wherein the wafer has been produced by manufacturing a silicon single crystal according to Czochralski method using a melt in contact with a quartz crucible, wherein
Ga (gallium) is added as a dopant that controls resistivity of the crystal,
boron is not added as a dopant that controls resistivity of the crystal,
the silicon single crystal has a resistivity controlled by the Ga in the range of from 5Ω.cm to 0.1Ω.cm, and
the diameter of the single crystal is 4 inches or more; and
processing the silicon single crystal to obtain the silicon single crystal wafer.

28. A process for generating photovoltaic energy, comprising subjecting a solar cell produced by the method according to claim 27 to light irradiation in air.

29. A method for producing a solar cell comprising:
making a solar cell from a wafer wherein the wafer has been produced by
manufacturing a silicon single crystal according to Czochralski method using a melt in contact with a quartz crucible, wherein
Ga (gallium) is added as a dopant that controls resistivity of the crystal, boron is not added as a dopant that controls resistivity of the crystal, the concentration of Ga in the silicon single crystal is in the range from $5 \times 10^{17}$ atoms/cm$^3$ to $3 \times 10^{15}$ atoms/cm$^3$, and the diameter of the single crystal is 4 inches or more; and processing the silicon single crystal to obtain the silicon single crystal wafer.

30. A process for generating photovoltaic energy, comprising subjecting the a solar cell produced by the method according to claim 29 to light irradiation in air.

31. A solar cell comprising a wafer having a diameter of 4 inches or more, manufactured from a silicon single crystal produced according to Czochralski method using a melt in contact with a quartz crucible, wherein Ga (gallium) is added as a dopant that controls resistivity of the crystal, boron is not added as a dopant that controls resistivity of the crystal, and the silicon single crystal has a resistivity in the range of from 5Ω.cm to 0.1Ω.cm.

32. A process for generating photovoltaic energy, comprising subjecting a solar cell according to claim 31 to light irradiation in air.

33. A solar cell comprising a wafer having a diameter of 4 inches or more, manufactured from a silicon single crystal according to Czochralski method using a melt in contact with a quartz crucible, wherein Ga (gallium) is added as a dopant that controls resistivity of the crystal, boron is not added as a dopant that controls resistivity of the crystal, and the concentration of Ga in the silicon single crystal is in the range from $5 \times 10^{17}$ atoms/cm$^3$ to $3 \times 10^{15}$ atoms/cm$^3$.

34. A process for generating photovoltaic energy, comprising subjecting a solar cell according to claim 33 to light irradiation in air.

35. A process for generating photovoltaic energy, comprising:

manufacturing a silicon single crystal according to Czochralski method using a melt in contact with a quartz crucible, wherein Ga (gallium) is added as a dopant that controls resistivity of the crystal, boron is not added as a dopant that controls resistivity of the crystal, the silicon single crystal has a resistivity controlled by the Ga in the range of from 5Ω.cm to 0.1Ω.cm, and the diameter of the single crystal is 4 inches or more;

processing the silicon single crystal to obtain a silicon single crystal wafer;

fabricating a solar cell from the silicon single crystal wafer, and subjecting the solar cell to light irradiation to produce photovoltaic energy.

36. The process for generating photovoltaic energy according to claim 35, wherein subjecting the solar cell to light irradiation to produce photovoltaic energy is conducted in air.

37. A process for generating photovoltaic energy, comprising:

manufacturing a silicon single crystal according to Czochralski method using a melt in contact with a quartz crucible, wherein Ga (gallium) is added as a dopant that controls resistivity of the crystal, boron is not added as a dopant that controls resistivity of the crystal, the concentration of Ga in the silicon single crystal is in the range from $5 \times 10^{17}$ atoms/cm$^3$ to $3 \times 10^{15}$ atoms/cm$^3$, and the diameter of the single crystal is 4 inches or more;

processing the silicon single crystal to obtain a silicon single crystal wafer;

fabricating a solar cell from the silicon single crystal wafer; and subjecting the solar cell to light irradiation to produce photovoltaic energy.

38. The process for generating photovoltaic energy according to claim 37, wherein subjecting the solar cell to light irradiation to produce photovoltaic energy is conducted in air.

* * * * *